US008488368B2

(12) United States Patent
Christensen et al.

(10) Patent No.: US 8,488,368 B2
(45) Date of Patent: Jul. 16, 2013

(54) METHOD FOR SELECTABLE GUARANTEED WRITE-THROUGH WITH EARLY READ SUPPRESSION

(75) Inventors: Todd A Christensen, Rochester, MN (US); Peter T. Freiburger, Rochester, MN (US); Jesse D. Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 13/019,542

(22) Filed: Feb. 2, 2011

(65) Prior Publication Data
US 2012/0195107 A1   Aug. 2, 2012

(51) Int. Cl.
*G11C 11/00*  (2006.01)
(52) U.S. Cl.
USPC ................................ 365/154; 365/230.03
(58) Field of Classification Search
USPC .......................................... 365/154, 230.03
See application file for complete search history.

(56) References Cited

U.S. PATENT DOCUMENTS

| 8,134,884 B2* | 3/2012 | Iwai .......................... 365/230.03 |
| 2005/0117436 A1* | 6/2005 | Cox .......................... 365/230.03 |
| 2006/0203585 A1* | 9/2006 | Lehmann et al. ............. 365/205 |

* cited by examiner

*Primary Examiner* — Michael Tran
(74) *Attorney, Agent, or Firm* — Bockhop & Associates LLC

(57) ABSTRACT

A static random access memory with write-through capability includes a memory cell configured to store a bit of data. A write enable signal is configured to enable writing a write value from a write line input into the static random access memory cell and to enable reading a read value from the memory cell onto a DOT line. A local evaluation circuit is configured to place the write value from the write line onto the DOT line during a single clock cycle in which the value is being written into the memory cell. An early read suppression circuit is configured to electrically isolate the DOT line from a data out line thereby preventing a leakage current loss from the local evaluation circuit and is also configured to make the value placed on the DOT line to be read from the data out line during the single clock cycle.

17 Claims, 4 Drawing Sheets

METHOD FOR SELECTABLE GUARANTEED WRITE-THROUGH WITH EARLY READ SUPPRESSION

BACKGROUND OF THE INVENTION

1. Field of the Invention

The present invention relates to digital circuits and, more specifically to a domino read static random access memory.

2. Description of the Related Art

Static random access memory (SRAM) is a type of volatile digital memory that retains data written to it so long as power is applied to the SRAM. One type of SRAM commonly used in high performance computational circuits is referred to as a "domino-read" SRAM. A domino-read SRAM can have write-though capability that allows a value being written into the SRAM to be read at the output of the SRAM in the same cycle that the value is being written. This feature is useful while performing memory and logic self tests.

When testing integrated circuits, techniques such as ABIST (Array Built In Self Test) and LBIST (Logic Built In Self Test) are used to test memory arrays (such as SRAM arrays) and logic elements. It is desirable to be able test the full latch to latch paths that are used in the chip function at the same frequency that will be used in the system application. If the circuits are tested at a slower frequency or part of the functional path is bypassed, then there could be delay defects that would not be caught by test but result in a failing chip when exercised in the system. This can be an expensive point to find and screen out failing parts.

In some cases, arrays are designed to be latch bounded. There are latches at all the address and data input pins and latches at the data output pins. The array typically would have one clock cycle to perform a read access and have the data captured in the output latch. The data outputs would be launched out of the array on the subsequent cycle. In other cases, arrays do not have an output latch and logic is placed after the array data outputs and downstream capture latches.

ABIST testing of the arrays is straightforward when testing latch bounded arrays. A typical existing non-latch bounded ABIST testing arrangement 10 is shown in FIG. 1. In the case of latch-bounded arrays, ABIST testing will test the entire path and if ABIST is run at system speed, delay defects will be caught. However, for arrays that are not output latch bounded, observation latches can be placed on the outputs so that ABIST testing is straightforward. Unfortunately, ABIST is not testing the full path since the downstream logic is not tested along with the array path. It is important to test the full latch to latch path that includes arrays and logic.

A typical domino read SRAM array is shown in FIG. 2. The SRAM includes a plurality of cells 20 that are each accessed by asserting a word line 14. Each of the SRAM cells 20 includes a pair of cross-coupled inverters 24 that maintain a current state between a pair of isolating transistors 22 that are allowed to conduct if the word line 14 is asserted. Asserting the word line 14 allows the inverters 24 to accept a new data value from a write line 16 (referred to as "WT_B") or write line WC 18 and to put its data on a BLC bit line 28 and BLT bit line 26.

A local evaluation circuit 40 is used to condition data being written to and read from the SRAM cell 20. The local evaluation circuit 40 (referred to as "LOCAL EVAL") includes a top half 42 and a bottom half 60, which are reflected copies of each other. (For the sake of simplicity, only the top half 42 is shown in detail herein.) Each half includes circuitry used to precharge a BLC line 26 and BLT line 28 used to write to or read from the SRAM cell 20. The circuitry includes a local precharge line 44 that couples a first PFET 46 to a voltage source and decouples the BLC line 26 when a low voltage is applied thereto, thereby causing the BLC line 26 to be precharged when not being accessed. During a write, the local precharge line 44 is raised, thereby decoupling the voltage source at PFET 46 and coupling the BLC line 26 to the write line 16 through NFET 48. This causes PFET 56 to enter into a conducting state (which indicates that a logic "1" is being written to the SRAM 20). On the other hand, if the local precharge line 44 has a high value and if the compliment of the write line 18 (referred to as "WC") has a high value, then both NFET 52 and NFET 54 will conduct, allowing bit line 28 to begin discharging. Also, when the local precharge line 44 has a low value, a second PFET 50 couples the voltage source to the bit line 28 and prevents the bit line 28 from discharging by turning off a first NFET 52, thereby precharging the bit line 28, resulting in NAND gate 70 turning off NFET 72 when write line 16 has a low value.

Data is read from a precharged DOT line 30. A global precharge signal 34 is coupled to the gate of a PFET 36 so that when the global precharge signal 34 has a low value, the PFET 36 couples the voltage source to the DOT line 30. A charge maintenance circuit 32 may also be employed to maintain a precharged condition of the DOT line 30.

In most cases, a new value being written to the SRAM 20 will appear on the DOT line 30 as it is being written to the SRAM 20, thus giving this circuit its "write-through" capability. In one case, referred to as an "early read" condition, where a "1" is being written to the SRAM 20 to overwrite a "0" currently stored therein, if the "0" driven by SRAM 20 on bit line 28 causes NAND gate 70 to output a "1" before PFET 56 is turned "on" by a "0" placed on write line 16, then NFET 72 will begin to conduct, thereby discharging DOT line 30. This discharge will be impossible to recover from until the next cycle, thereby resulting in an incorrect value being read on the DOT line 30 during the "write-through."

A global precharge signal 34 is coupled to the gate of a PFET 36 through guaranteed write through circuit 100. PFET 36 selectively precharges the DOT line 30. A charge maintenance circuit 32 may also be employed to maintain a precharged condition of the DOT line 30.

To prevent the DOT line 30 from discharging prematurely during an early read, a guaranteed write through circuit 100 is added to the global precharge line 34. The guaranteed write through circuit 100 ensures that PFET 36 is in a conducting state (i.e., charging DOT line 30) whenever either the global precharge line 34 is in a precharging state or the write line 16 is in a state that would result in a "1" being written to the SRAM 20. In one embodiment, the guaranteed write through circuit 100 includes an AND gate 110 having the global precharge line 34 and the write line 16 as inputs. The output 112 of the AND gate 110 will be a logical "0" when either of these two inputs has a value corresponding to a "0" (which is the case if either precharging is occurring or if a "1" is being written to the SRAM 20). When the output of the AND gate 110 is a "0," the PFET 36 will couple the DOT line 30 to the voltage source, causing the DOT line 30 to be in a charged state.

This circuit guarantees that a write through will occur on data of both a zero and a one and is selectable. However, using it with certain local evaluation circuits can result in unwanted leakage power. In fact, certain local evaluation circuits can experience an early read without the ability of recovering the bit line 28 completely. This can result in the dot pull down device 72 being turned on partially while the pull up device 36 is held on, resulting in unwanted power dissipation. Additionally, the pull up device 36 on the dot node, even though it presents a small load, it is still on the critical path through the SRAM and, therefore, the power it draws can have affect data integrity.

Therefore, there is a need for an SRAM with a write-through capability that minimizes leakage power dissipation.

SUMMARY OF THE INVENTION

The disadvantages of the prior art are overcome by the present invention which, in one aspect, is a static random access memory with write-through capability that includes a memory cell configured to store a bit of data. A write enable signal is configured to enable writing a write value from a write line input into the static random access memory cell and to enable reading a read value from the memory cell onto a DOT line. A local evaluation circuit is configured to place the write value from the write line onto the DOT line during a single clock cycle in which the value is being written into the memory cell. An early read suppression circuit is configured to electrically isolate the DOT line from a data out line thereby preventing a leakage current loss from the local evaluation circuit and is also configured to make the value placed on the DOT line to be read from the data out line during the single clock cycle.

In another aspect, the invention is a static random access memory circuit that includes a static random access memory cell. A write enable signal is configured to enable writing a value from a write line input into the memory cell and to enable reading a value from the static random access memory cell onto a DOT line. A local evaluation circuit is configured to place the value from the write line onto the DOT line during a single clock cycle in which the value is being written into the memory cell. A first isolation field effect transistor that has a gate selectively places a value corresponding to the write value onto an intermediate line. A NAND gate is coupled to a select line and a line having a value corresponding to the write value. The NAND gate has an output coupled to the gate of the isolation field effect transistor. A flip-flop is responsive to the intermediate line and is configured to generate an output value onto the data out line in response to an assertion of a clock signal. The output value corresponds to the intermediate line value.

In yet another aspect, the invention is a method of accessing a static random access memory data storage cell with write-through capability, in which a value to be written to the static random access memory data storage cell is placed onto a write line. A DOT line is precharged. The DOT line is discharged when the value to be written corresponds to a logic "0." The DOT line is electrically isolated from a data out line unless a select signal is asserted. An intermediate line is selectively charged or discharged so that the intermediate line has a charge corresponding to the value to be written when the select signal is asserted. A data out line is charged to a value corresponding to the intermediate line and the value to be written is written to the static random access memory data storage cell upon assertion of a clock signal.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
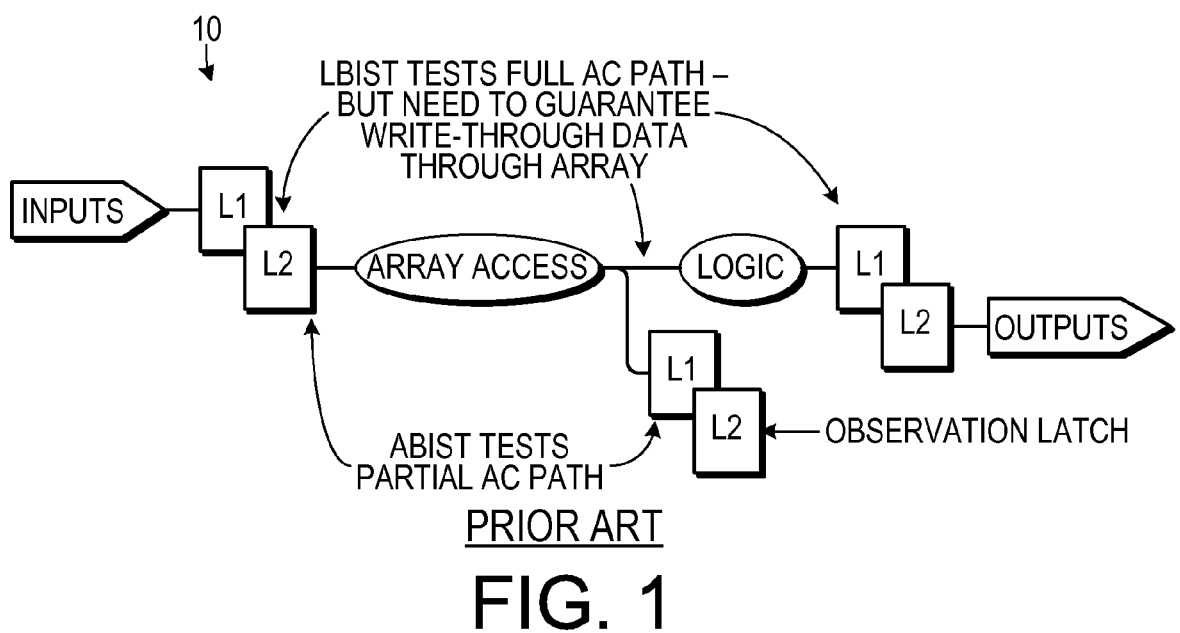
FIG. 1 is a block diagram of a prior art ABIST testing arrangement.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

U.S. Pat. No. 7,782,691, issued to Christensen et al., discloses a configuration of a domino read SRAM with guaranteed write through and is incorporated by reference herein for the purpose of disclosure of a domino read SRAM.

One embodiment includes a domino read SRAM that minimizes leakage current that might otherwise flow through a local evaluation circuit by electrically isolating the local evaluation circuit from the data out line. Even though the data out line is isolated from the local evaluation circuit, the value being written into the SRAM storage cell is also placed on the data out line by an early read suppression circuit, thereby giving the circuit read through functionality while reducing current in certain situations.

Figure 2:
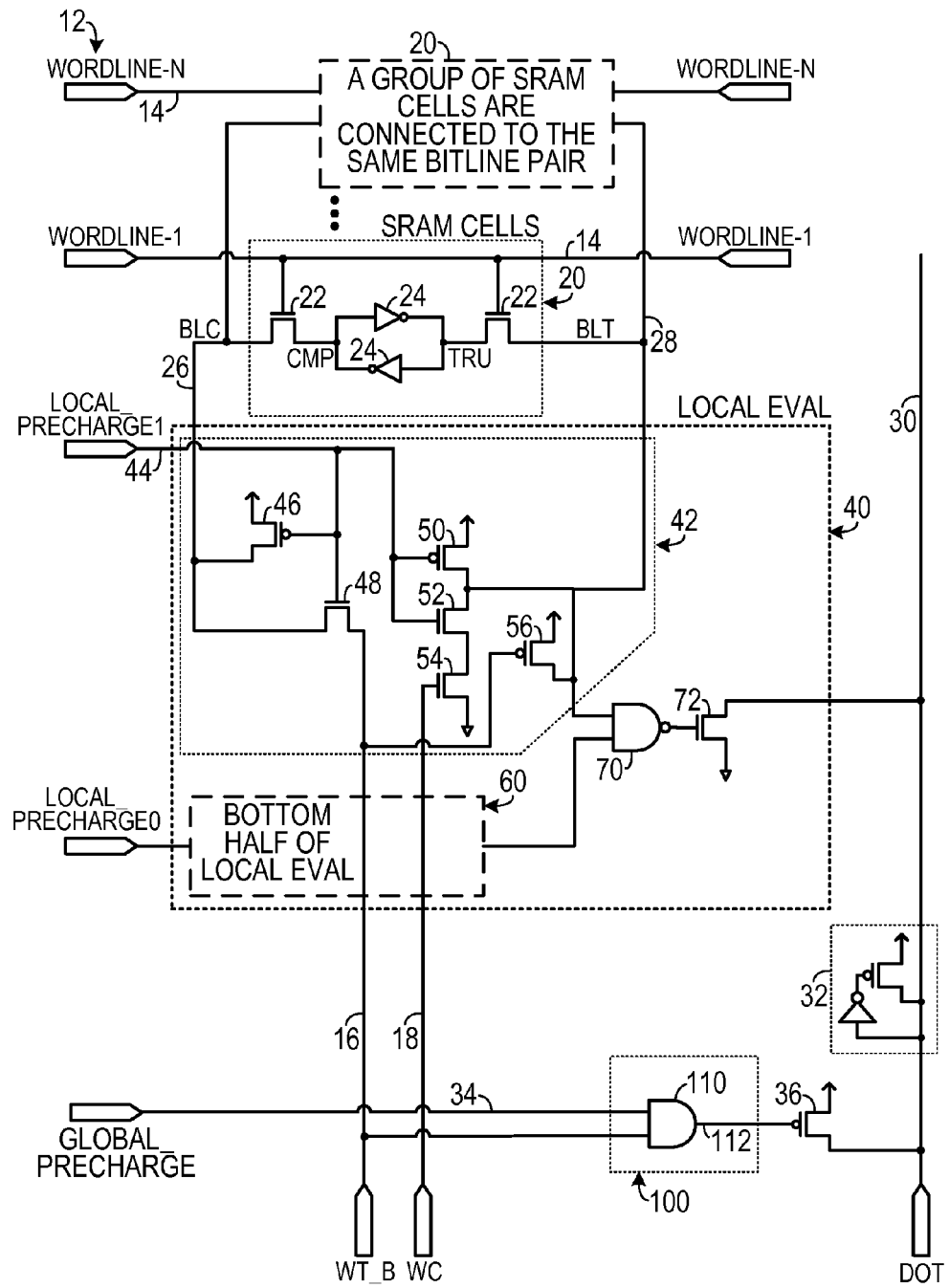
FIG. 2 is a schematic diagram of a prior art SRAM device.
Figure 3:
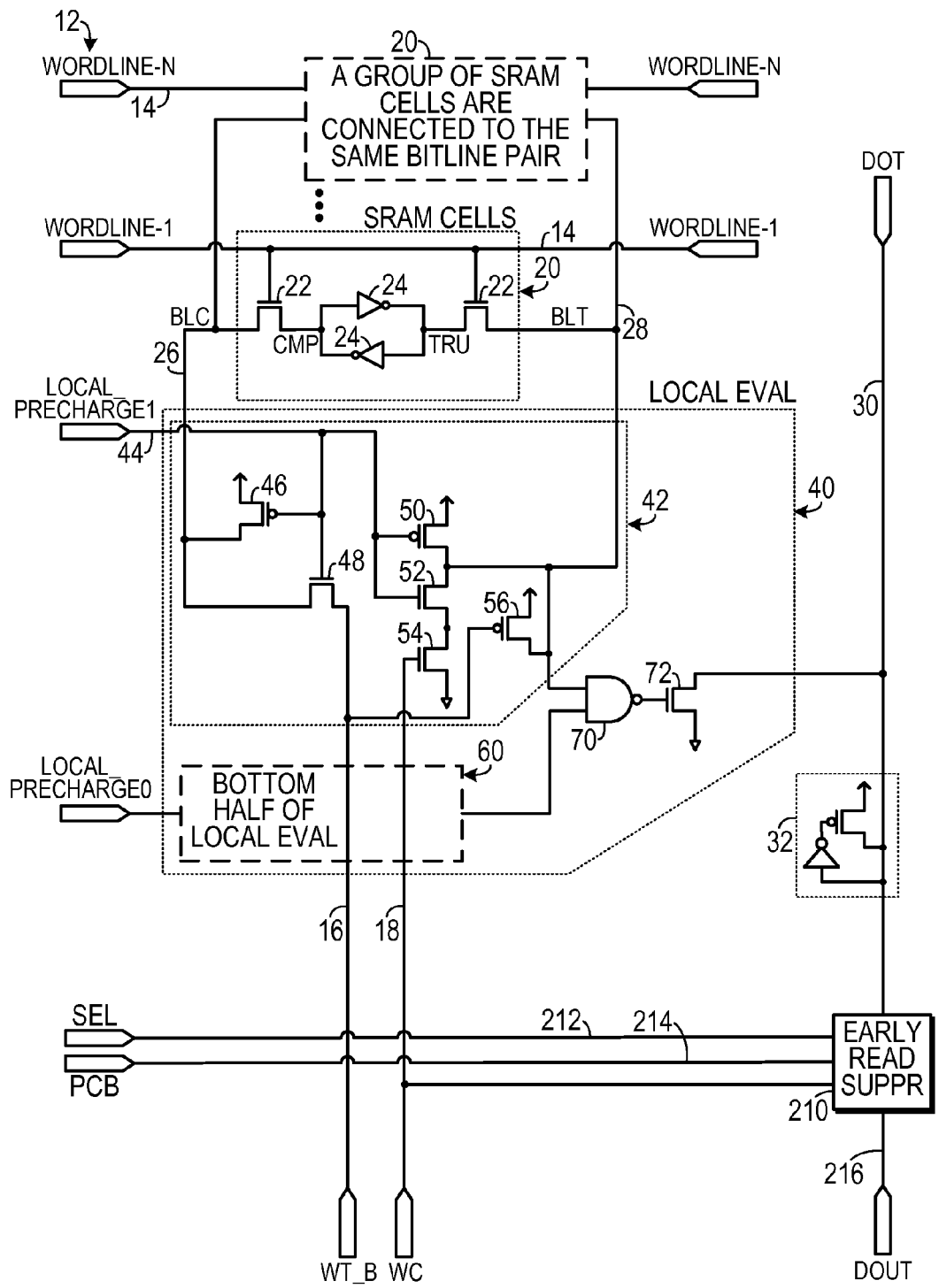
FIG. 3 is a schematic diagram of an SRAM device employing an early read suppression circuit.

As shown in FIG. 3, one embodiment includes most of the circuitry disclosed above in reference to FIG. 2, including a memory cell 20 that stores a bit of data, a word line write enable signal 14 that enables access to the memory cell 20 and a local evaluation circuit 40 that places the value being written onto the DOT line 30 during a single clock cycle in which the value is being written into the memory cell 20. However, it also employs an early read suppression circuit 210 that electrically isolates the DOT line 30 from the read output DOUT line 216 while placing the value being written into the SRAM cell 220 onto the DOUT line 216. The early read suppression circuit 210 generates the value placed on the DOUT line 216 based on the values of a select line 212, a PCB clock line 214 and the WC write compliment line 18. The electrical isolation of the DOT line 30 from the DOUT line 216 prevents leakage current loss from the local evaluation circuit 40 through PFET 72.

Figure 4A:
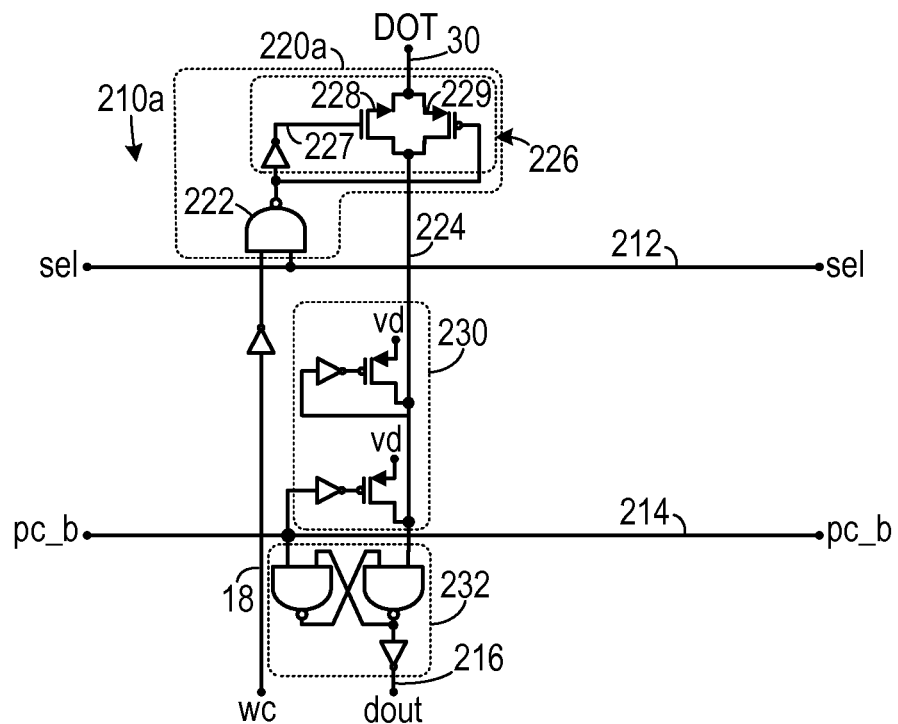
FIGS. 4A and 4B are schematic diagrams of different embodiments of early read suppression circuits.

One embodiment of the early read suppression circuit 210a is shown in FIG. 4A. This embodiment includes an isolation circuit 220a that selectively places an intermediate line value that corresponds to a current value on the DOT line 30 onto an intermediate line 224. The isolation circuit 220a includes a NAND gate 222 that is coupled to a select line 212 and a compliment of the WC write compliment line 18 and a switch circuit 226 that is configured to couple the DOT line to the intermediate line 224 when the select line 212 and the write compliment line 18 each have a logic "1" value. The switch circuit 226 includes an n-type field effect transistor 228 (NFET) having a source coupled to the DOT line 30, a gate coupled to an inverse 227 of the output of the NAND gate 222 and a drain coupled to the intermediate line 224. A p-type field effect transistor 229 (PFET) has a source that is coupled to the DOT line 30, a gate coupled to the output of the NAND gate 222 and a drain coupled to the intermediate line 224. This embodiment of the early read suppression circuit 210a also includes a flip-flop 232 that is responsive to the intermediate line 224 and that generates an output value onto the data out line 216 in response to an assertion of a clock signal 214. The output value corresponds to the intermediate line value 224.

A charge maintenance circuit 230 is coupled to the intermediate line 224 and senses a high voltage value on the intermediate line 224. The charge maintenance circuit 230 also couples a voltage source (vd) to the intermediate line 224 upon sensing the high voltage value.

Figure 4B:
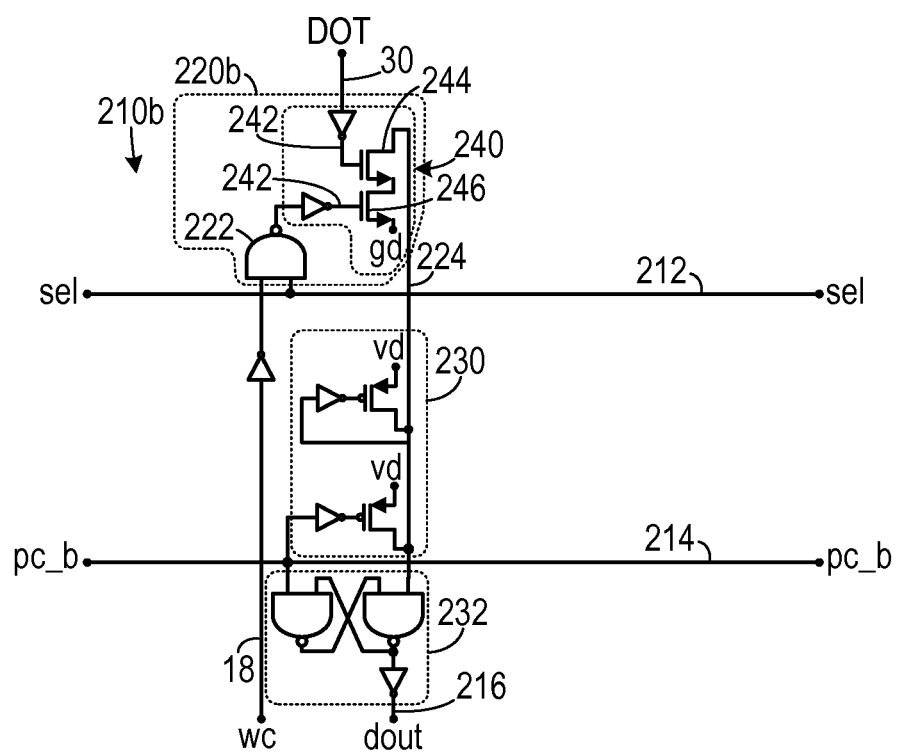

One embodiment of the early read suppression circuit 210b, as shown in FIG. 4B, completely isolates the intermediated line 224 from the DOT line 30. In this embodiment, the isolation circuit 220b includes a switch circuit 240 that couples a ground to the intermediate line when the select line has a logic "1" value, when a complement of the write line has a logic "0" value and when the DOT line has a logic "0" value. The switch circuit 240 includes a first transistor 244 (such as an NFET in this embodiment) that has a source coupled to the intermediate line 224, a gate coupled to a compliment 242 of the DOT line 230 and a drain. A second transistor 246 (which is also an NFET in this embodiment) has a source coupled to the drain of the first transistor 244, a gate coupled to a compliment 242 of the output of the NAND gate 222 and a drain coupled to the ground (gd).

In operation, system places the value to be written to the static random access memory data storage cell 20 onto a write line 16 or the write compliment line 18 and the DOT line 30 is precharged. The DOT 30 line is discharged by the local evaluation circuit 40 through NFET 72 when the value to be written corresponds to a logic "0." The DOT line 30 is electrically isolated from the data out line 216. The intermediate line 224 is maintained in a charged state by the charge maintenance circuit 230 unless the intermediate line 224 has a value corresponding to a logic "0" thereon. The intermediate line 224 is selectively charged or discharged depending on the value on the select line 212 so that the intermediate line 224 has a charge corresponding to the value on the WC write compliment line 224. This may be done in one embodiment by coupling the DOT line 30 to the intermediate line 224 when the value to be written comprises a logic "1" and a select line 212 is asserted. In an alternate embodiment, this is done by coupling the intermediate line 224 to a ground (gd) when a write compliment line 18 has a logic "0" value, the select line 212 is asserted and the DOT line 30 has a logic "0" value. The data out line 216 is charged to a value corresponding to the value on the intermediate line 224 and the value to be written is written to the static random access memory data storage cell 20 upon assertion of word line 14.

The embodiments disclosed above include a method for selectable guaranteed write through that writes through the value being written to the SRAM cell to the DOT line and that places that value on the DOUT line, while isolating it from the DOT line. This eliminates any potential unwanted power dissipation through the local evaluation circuit and does not affect the critical path.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A static random access memory with write-through capability, comprising:

a. a memory cell configured to store a bit of data;
 b. a write enable signal configured to enable writing a write value from a write line input into the static random access memory cell and to enable reading a read value from the memory cell onto a DOT line;
 c. a local evaluation circuit configured to place the write value from the write line onto the DOT line during a single clock cycle in which the value is being written into the memory cell; and
 d. an early read suppression circuit configured to electrically isolate the DOT line from a data out line thereby preventing a leakage current loss from the local evaluation circuit and also configured to make the value placed on the DOT line to be read from the data out line during the single clock cycle.

2. The static random access memory with write-through capability of claim 1, wherein the early read suppression circuit comprises:

a. an isolation circuit that is configured to selectively place onto an intermediate line an intermediate line value that corresponds to a current value on the DOT line; and
 b. a flip-flop that is responsive to the intermediate line and that is configured to generate an output value onto the data out line in response to an assertion of a clock signal, the output value corresponding to the intermediate line value.

3. The static random access memory with write-through capability of claim 2, further comprising a charge maintenance circuit coupled to the intermediate line and configured to sense a high voltage value on the intermediate line and to couple a voltage source to the intermediate line upon sensing the high voltage value.

4. The static random access memory with write-through capability of claim 2, wherein the isolation circuit comprises:

a. a NAND gate coupled to a select line and a line having a value corresponding to the write value; and
 b. a switch circuit that is configured to couple the DOT line to the intermediate line when the select line and the write line each have a logic "1" value.

5. The static random access memory with write-through capability of claim 4, wherein the switch circuit comprises:

a. an n-type field effect transistor having a source coupled to the DOT line, a gate coupled to an inverse of the output of the NAND gate and a drain coupled to the intermediate line; and
 b. a p-type field effect transistor having a source coupled to the DOT line, a gate coupled to the output of the NAND gate and a drain coupled to the intermediate line.

6. The static random access memory with write-through capability of claim 2, wherein the isolation circuit comprises:

a. a NAND gate coupled to a select line and a line having a value corresponding to the write value; and
 b. a switch circuit that is configured to couple a ground to the intermediate line when the select line has a logic "1" value, when a complement of the write line has a logic "0" value and when the DOT line has a logic "0" value.

7. The static random access memory with write-through capability of claim 6, wherein the switch circuit comprises:

a. a first transistor having a source coupled to the intermediate line, a gate coupled to a compliment of the DOT line and a drain;
 b. a second transistor having a source coupled to the drain of the first transistor, a gate coupled to a compliment of the output of the NAND gate and a drain coupled to the ground.

8. The static random access memory with write-through capability of claim 7, wherein the first transistor and the second transistor each comprise an n-type field effect transistor.

9. A static random access memory circuit, comprising:
a. a static random access memory cell;
b. a write enable signal configured to enable writing a value from a write line input into the memory cell and to enable reading a value from the static random access memory cell onto a DOT line;
c. a local evaluation circuit configured to place the value from the write line onto the DOT line during a single clock cycle in which the value is being written into the memory cell;
d. a first isolation field effect transistor, having a gate, that selectively places a value corresponding to the write value onto an intermediate line;
e. a NAND gate coupled to a select line and a line having a value corresponding to the write value, the NAND gate having an output coupled to the gate of the isolation field effect transistor;
f. a flip-flop that is responsive to the intermediate line and that is configured to generate an output value onto the data out line in response to an assertion of a clock signal, the output value corresponding to the intermediate line value.

10. The static random access memory circuit of claim 9, further comprising a charge maintenance circuit coupled to the intermediate line and configured to sense a high voltage value on the intermediate line and to couple a voltage source to the intermediate line upon sensing the high voltage value.

11. The static random access memory circuit of claim 9, wherein the first field effect transistor is an n-type field effect transistor having a source coupled to the DOT line, a gate coupled to a compliment of the output of the NAND gate and a drain coupled to the intermediate line and further comprising a second, p-type, field effect transistor having a source coupled to the DOT line, a gate coupled to the output of the NAND gate and a drain coupled to the intermediate line.

12. The static random access memory circuit of claim 9, wherein the first field effect transistor has a source coupled to the intermediate line, a gate coupled to a compliment of the DOT line and a drain and further comprising a second field effect transistor having a source coupled to the drain of the first transistor, a gate coupled to a compliment of the output of the NAND gate and a drain coupled to the ground.

13. The static random access memory circuit of claim 12, wherein the first field effect transistor and the second field effect transistor each comprise an n-type field effect transistor.

14. A method of accessing a static random access memory data storage cell with write-through capability, comprising the steps of:
a. placing a value to be written to the static random access memory data storage cell onto a write line;
b. precharging a DOT line;
c. when the value to be written corresponds to a logic "0" then discharging the DOT line;
d. electrically isolating the DOT line from a data out line;
e. selectively charging or discharging an intermediate line so that the intermediate line has a charge corresponding to the value to be written when the select signal is asserted; and
f. charging the data out line to a value corresponding to the intermediate line and writing the value to be written to the static random access memory data storage cell upon assertion of a word line signal.

15. The method of claim 14, further comprising the step of maintaining the intermediate line in a charged state unless the intermediate line has a value corresponding to a logic "0" thereon.

16. The method of claim 14, wherein the selectively charging step comprises coupling the DOT line to the intermediate line when the value to be written comprises a logic "1" and a select line is asserted.

17. The method of claim 14, wherein the selectively charging step comprises coupling the intermediate line to a ground when a write compliment line has a logic "0" value, a select line is asserted and the DOT line has a logic "0" value.

* * * * *